(12) United States Patent
Pei

(10) Patent No.: US 8,623,143 B2
(45) Date of Patent: Jan. 7, 2014

(54) VAPOR DEPOSITION APPARATUS

(75) Inventor: Shao-Kai Pei, Taipei Hsien (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 710 days.

(21) Appl. No.: 12/882,182

(22) Filed: Sep. 14, 2010

(65) Prior Publication Data

US 2011/0283943 A1 Nov. 24, 2011

(30) Foreign Application Priority Data

May 18, 2010 (TW) .............................. 99115769 A

(51) Int. Cl.
C23C 16/00 (2006.01)

(52) U.S. Cl.
USPC ......................................... 118/726; 118/727

(58) Field of Classification Search
USPC .................................. 118/726, 727
See application file for complete search history.

(56) References Cited

U.S. PATENT DOCUMENTS

| | | | |
|---|---|---|---|
| 4,607,152 A * | 8/1986 | Allovon et al. ............... | 219/390 |
| 4,787,333 A * | 11/1988 | Kamino et al. ............... | 118/726 |
| 5,236,510 A * | 8/1993 | Brennesholtz ............... | 118/721 |
| 6,142,097 A | 11/2000 | Tomofuji | |
| 2003/0106644 A1 * | 6/2003 | Sirkis et al. ............... | 156/345.48 |
| 2005/0072361 A1 * | 4/2005 | Yang et al. ..................... | 118/726 |
| 2006/0213441 A1 * | 9/2006 | Kobrin et al. ................. | 118/715 |

FOREIGN PATENT DOCUMENTS

| | | |
|---|---|---|
| CN | 1582071 A | 2/2005 |
| CN | 1928149 A | 3/2007 |
| CN | 101620279 A | 1/2010 |
| JP | 02-209465 A | 8/1990 |
| JP | 2008-108611 A | 5/2008 |

* cited by examiner

*Primary Examiner* — Keath Chen
(74) *Attorney, Agent, or Firm* — Altis Law Group, Inc.

(57) ABSTRACT

A vapor deposition apparatus includes a deposition chamber, an umbrella-shaped supporting member, a plurality of coating precursor sources. The umbrella-shaped supporting member is received in the deposition chamber. The supporting member is configured for supporting a number of workpieces. The coating precursor sources oppose the supporting member. Each coating precursor source includes a stationary sleeve and a moveable member moveably received in the stationary sleeve. The moveable member defines a recess for receiving a coating material in a top end of the moveable member opposing the supporting member. The moveable members are moveable relative to the respective stationary sleeve such that a distance between the supporting member and the coating material in each recess can be adjusted.

7 Claims, 3 Drawing Sheets

VAPOR DEPOSITION APPARATUS

BACKGROUND

1. Technical Field

The present disclosure relates to vapor deposition apparatuses.

2. Description of Related Art

Generally, a vapor deposition apparatus for coating a number of workpieces, such as plastic lenses, includes a deposition chamber, a coating precursor source for producing vaporized material, and a supporting member for mounting the workpieces to be coated by the vaporized material. The coating precursor source is positioned in the lower portion of the deposition chamber. The supporting member is mounted to a rotating shaft located in the upper portion of the deposition chamber. The support member is typically umbrella-shaped and holds or suspends workpieces over the coating precursor sources. However, this results in different distances between various coating materials in the coating precursor sources in the deposition chamber and the supporting member. This may cause non-uniform coatings on the workpieces.

Therefore, a vapor deposition apparatus, which can overcome the above-mentioned problems, is needed.

DETAILED DESCRIPTION

Figure 1:
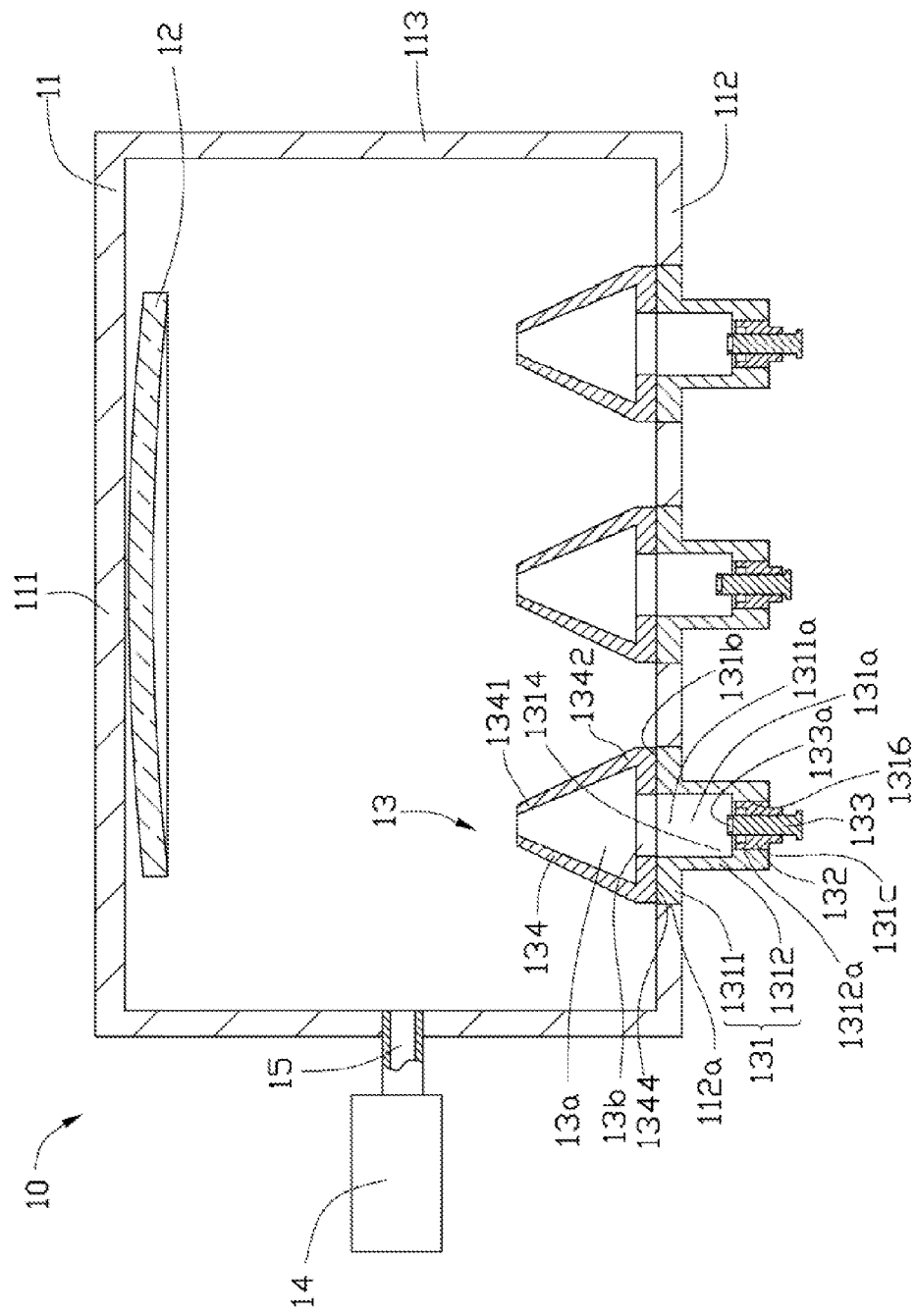
FIG. 1 is a sectional view of a vapor deposition apparatus including a number of coating precursor sources, according to an exemplary embodiment.

Referring to FIG. 1, a vapor deposition apparatus 10, according to an exemplary embodiment, includes a deposition chamber 11, a supporting member 12, a number of coating precursor sources 13, and a plasma generating source 14.

The deposition chamber 11 is substantially cylindrical and includes a top panel 111, a bottom panel 112 and a side panel 113 connecting the top panel 111 and the bottom panel 112. The top panel 111 opposes the bottom panel 112. A number of through holes 112a are defined in the bottom panel 112.

The supporting member 12 is substantially umbrella-shaped and is mounted to the top panel 111. The supporting member 12 is configured for supporting a number of workpieces (not shown).

Figure 2:
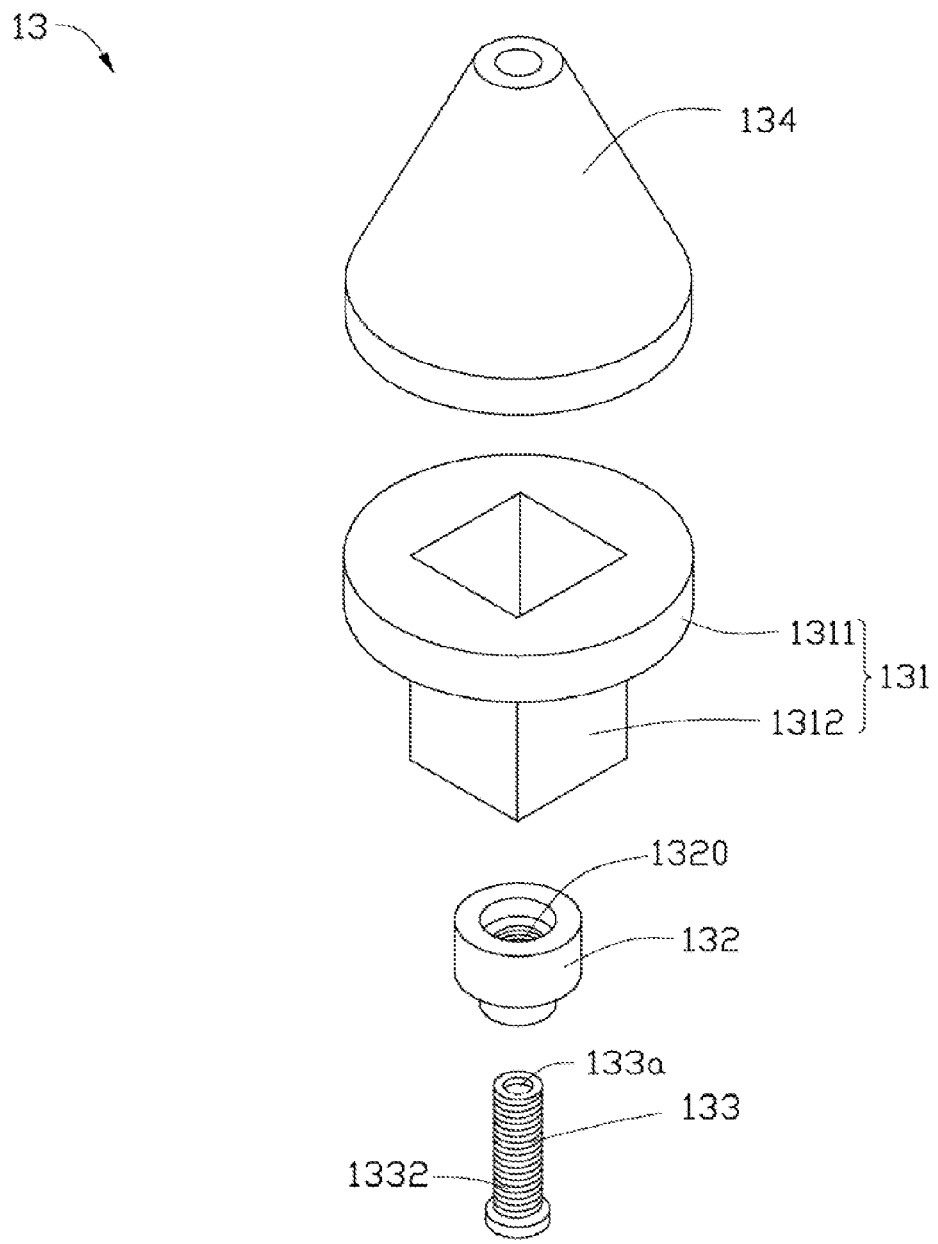
FIG. 2 is an exploded view of a single exemplary coating precursor source of FIG. 1.
Figure 3:
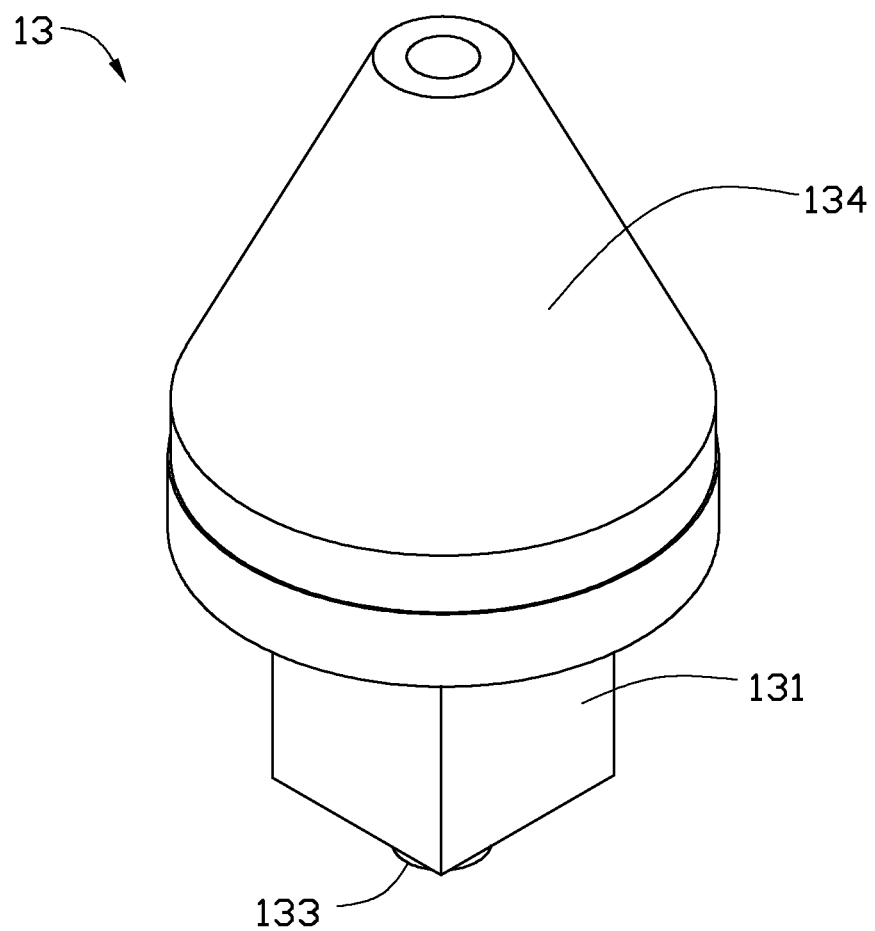
FIG. 3 is an assembled view of the coating precursor source of FIG. 2.

Further referring to FIGS. 2 and 3, each coating precursor source 13 is engaged in a corresponding through hole 112a in an airtight fashion, opposing the supporting member 12. The coating precursor source 13 includes a mounting member 131, a stationary sleeve 132, a moveable member 133 and an emanating head 134.

The mounting member 131 includes a first connecting portion 1311 and a second connecting portion 1312 at opposite ends of the mounting member 131. The first connection portion 1311 is substantially plate-shaped and is received in the through hole 112a in an airtight fashion. The second connecting portion 1312 is substantially cuboid and is located outside the deposition chamber 11. The mounting member 131 defines a central stepped through hole 131a through the first connecting portion 1311 and the second connecting portion 1312. The central stepped through hole 131a forms a first opening 1311a at the first connecting portion 1311 and a second opening 1312a at the second connecting portion 1312. Beneficially, the first connecting portion 1311 and the second connecting portion 1312 cooperatively constitute a unitary piece to avoid air leakage. The first opening 1311a communicates the mounting member 131 with the emanating head 134. The mounting member 131 includes an upper surface 131b and a lower surface 131c. The upper surface 131b and the lower surface 131c are positioned at opposite sides of the mounting member 131. The central stepped through hole 131a extends from the upper surface 113b to the lower surface 131c and includes a first through hole portion 1314 and a second through hole portion 1316 communicating, with the first through hole portion 1314. The first through hole portion 1314 and the second through hole portion 1316 are arranged in that order from the upper surface 131b to the lower surface 131c The first through hole portion 1314 is substantially cuboid, and the second through hole portion 1316 is substantially cylindrical. The width of the first through hole portion 1314 is lager than the diameter of the second through hole portion 1316.

The stationary sleeve 132 is internally threaded and fixedly received in the second through hole portion 1316 in an airtight fashion. The stationary sleeve 132 defines a threaded hole 1320 in a central portion thereof.

The moveable member 133 is post-shaped and has external threads 1332. The external threads 1332 engages in the threaded hole 1320 so that the moveable member 133 is screwed into the stationary sleeve 132. The moveable member 133 penetrates through the stationary sleeve 132 and is inserted into the first through hole portion 1314. The moveable member 133 can move up and down along a direction from the coating precursor source 13 to the supporting member 12 in the first through hole portion 1314. A recess 133a is defined in a top end of the moveable member 133. The top end of the moveable member 133 opposes the supporting member 12. A coating material (not shown) may be placed in the recess 133a and can move together with the moveable member 133.

An axial length of the central stepped through hole 131a is greater than that of the moveable member 133 to provide enough room for the movement of the moveable member 133.

The emanating head 134 defines a truncated conical cavity 13a and a passing hole 13b therein. The emanating head 134 includes a first open end 1341 and a second open end 1342 at opposite ends of the emanating head 134. The emanating head 134 tapers from the second open end 1342 to the first open end 1341. The first open end 1341 opposes the supporting member 12 and serves as a nozzle for emanating vaporized coating material from the coating precursor source 13. The second open end 1342 has a bottom surface 1344 which is attached to the upper surface 131b. The truncated conical cavity 13a and the passing hole 13b are arranged in that order from the first open end 1341 to the second open end 1342. The passing hole 13b communicates with the truncated conical cavity 13a and passes through the bottom surface 1344. The truncated conical cavity 13a is in communication with the central stepped through hole 131a through the passing hole 13b. Initially, the vaporized coating material stays in the coating precursor source 13. When a concentration of the vaporized coating material reaches a predetermined value, the vaporized coating material is emanated from the coating precursor source 13 through the first open end 1341. This enhances mobility of the vaporized coating material.

The plasma generating source 14 is connected to the deposition chamber 11 by a pipe 15 at the side panel 113. The plasma generated in the plasma generating source 14 is introduced into the deposition chamber 11 through the pipe 15.

When in use, although the supporting member 12 is substantially umbrella-shaped, a distance between the coating material received in the recess 133a and the supporting member 12 can be adjusted depending upon locations of the workpieces on the supporting member 12. For example, the moveable members 133, having the coating material received in the recess 133a corresponding to the workpieces away from the center of the supporting member 12, can be partially unscrewed to close the distance between the coating material and the workpieces attached to the supporting member 12. The moveable members 133, having the coating material received in the recess 133a corresponding to the workpieces adjacent to the center of the supporting member 12, are screwed further in. In this way, distances between the coating materials and the workpieces can be substantially the same, and thus the workpieces can be coated uniformly.

Furthermore, since the distance between the coating material and the workpiece is adjustable, vaporization speed can be controlled to adjust a thickness of the coating on the workpiece. Contamination of the coating material by the plasma can be avoided or at least alleviated because the coating material is received in the recess 133a.

It is to be understood, however, that even though numerous characteristics and advantages of the present embodiments have been set forth in the foregoing description, together with details of the structures and functions of the embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A vapor deposition apparatus, comprising:
a deposition chamber comprising a top panel and a bottom panel opposite to the top panel, a plurality of through holes defined in the bottom panel;
an umbrella-shaped supporting member received in the deposition chamber and mounted to the top panel, the supporting member configured for supporting a plurality of workpieces; and
a plurality of coating precursor sources opposing the supporting member and corresponding to the through holes, each coating precursor source engaged in a corresponding through hole in an airtight fashion and comprising a mounting member, an emanating head, a stationary sleeve and a moveable member moveably received in the stationary sleeve, the mounting member comprising a first connecting portion received in the corresponding through hole and a second connecting portion at opposite ends of the mounting member, the second connecting portion located outside the deposition chamber, the first connecting portion being larger than the second connecting portion, the bottom of the emanating head matched the top of the first connection portion and attached to the top of the first connecting portion, the mounting member and the emanating head defining a central stepped through hole passing through the emanating head, the first connecting portion and the second connecting portion, the stationary sleeve received in the second through hole portion in an airtight fashion, the moveable member defining a recess for receiving a coating material in a top end of the moveable member opposing the supporting member, wherein the moveable members penetrate through the stationary sleeve and are inserted into the second connecting portion and are moveable relative to the respective stationary sleeve in the second connecting portion such that a distance between the supporting member and the coating material in each recess can be adjusted.

2. The vapor deposition apparatus of claim 1. wherein the stationary sleeve defines a threaded hole in a central portion thereof, the moveable member has external threads, and the external threads engages in the threaded hole such that the moveable member is moveably screwed into the stationary sleeve.

3. The vapor deposition apparatus of claim 1, wherein the mounting member comprises an upper surface and a lower surface at opposite ends thereof, the emanating head defines a truncated conical cavity and a passing hole therein, the emanating head comprises a first open end and a second open end at opposite ends thereof, the emanating head tapers from the second open end to the first open end, the first open end opposes the supporting member, the second open end has a bottom surface attached to the upper surface, the truncated conical cavity and the passing hole are arranged in that order from the first open end to the second open end, the passing hole communicates with the truncated conical cavity and passes through the bottom surface, and the truncated conical cavity is in communication with the central stepped through hole.

4. The vapor deposition apparatus of claim 3, wherein an axial length of the central stepped through hole is greater than that of the moveable member.

5. The vapor deposition apparatus of claim 3, wherein the first connecting portion and the second connecting portion cooperatively constitute a unitary piece.

6. The vapor deposition apparatus of claim 5, further comprising a plasma generating source, wherein the deposition chamber further comprises a side panel connecting the top panel and the bottom panel, the plasma generating source is connected to the deposition chamber at the side panel, and the plasma generating source is configured for providing plasma into the deposition chamber.

7. The vapor deposition apparatus of claim 1, wherein a hole within the mounting member is substantially cuboid.

* * * * *